(12) United States Patent
Zhong et al.

(10) Patent No.: US 9,194,925 B2
(45) Date of Patent: Nov. 24, 2015

(54) FAT AND IRON QUANTIFICATION USING A MULTI-STEP ADAPTIVE FITTING APPROACH WITH MULTI-ECHO MAGNETIC RESONANCE IMAGING

(71) Applicants: Xiaodong Zhong, Lilburn, GA (US); Marcel Dominik Nickel, Erlangen (DE); Stephan Kannengiesser, Wuppertal (DE)

(72) Inventors: Xiaodong Zhong, Lilburn, GA (US); Marcel Dominik Nickel, Erlangen (DE); Stephan Kannengiesser, Wuppertal (DE)

(73) Assignees: Siemens Medical Solutions USA, Inc., Malvern, PA (US); Siemens Aktiengesellschaft, Munich (DE)

( * ) Notice: Subject to any disclaimer, the term of this patent is extended or adjusted under 35 U.S.C. 154(b) by 132 days.

(21) Appl. No.: 14/054,903

(22) Filed: Oct. 16, 2013

(65) Prior Publication Data
US 2014/0126795 A1    May 8, 2014

Related U.S. Application Data

(60) Provisional application No. 61/722,278, filed on Nov. 5, 2012.

(51) Int. Cl.
*G01R 33/50* (2006.01)
*G01R 33/48* (2006.01)

(52) U.S. Cl.
CPC ............ *G01R 33/4828* (2013.01); *G01R 33/50* (2013.01)

(58) Field of Classification Search
None
See application file for complete search history.

(56) References Cited

U.S. PATENT DOCUMENTS

| 2006/0250132 | A1* | 11/2006 | Reeder et al. | 324/307 |
| 2011/0096974 | A1* | 4/2011 | Gilson | 382/131 |
| 2011/0140696 | A1* | 6/2011 | Yu | 324/309 |

* cited by examiner

*Primary Examiner* — Siamak Harandi
(74) *Attorney, Agent, or Firm* — Peter R. Withstandley

(57) ABSTRACT

A computer-implemented method for quantifying fat and iron in anatomical tissue includes acquiring a plurality of multi-echo signal datasets representative of the anatomical tissue using a magnetic resonance (MR) pulse sequence. A plurality of multi-echo signal datasets are selected from the plurality of multi-echo signal datasets and used to determine a first water magnitude value and a first fat magnitude value. In response to determining that the multi-echo signal datasets include at least three multi-echo datasets, a first stage analysis is performed. This first stage analysis comprises selecting a first effective transverse relaxation rate value. Next, first algorithm inputs comprising the first water magnitude value, the first fat magnitude value, and the first effective transverse relation rate value are created. Then, a non-linear fitting algorithm is performed based on the first algorithm inputs to calculate a second water magnitude value, a second fat magnitude value, and a second effective transverse relaxation rate value. A first proton density fat fraction value is then determined based on the second water magnitude value and the second fat magnitude value.

20 Claims, 6 Drawing Sheets

FAT AND IRON QUANTIFICATION USING A MULTI-STEP ADAPTIVE FITTING APPROACH WITH MULTI-ECHO MAGNETIC RESONANCE IMAGING

CROSS-REFERENCE TO RELATED APPLICATIONS

This application claims priority to U.S. provisional application Ser. No. 61/722,278 filed Nov. 5, 2012 which is incorporated herein by reference in its entirety.

TECHNICAL FIELD

The present disclosure relates generally to methods, systems, and apparatuses for quantifying fat and iron using a multi-step, adaptive fitting approach with multi-echo magnetic resonance imaging. The disclosed methods, systems, and apparatuses may be applied, for example, to diagnose and quantify diseases such as hepatic steatosis.

BACKGROUND

Many diseases can increase the fat or iron deposition of tissues compared to normal status. For example, with respect to liver diseases, hepatic steatosis is an indication of hepatic diseases such as nonalcoholic fatty liver disease. Additionally, increased iron deposition is associated with chronic viral hepatitis, alcoholic liver disease, and nonalcoholic steatohepatitis. Outside of the area of liver diseases, the quantification of fat and iron deposition is of interest in areas such as the diagnosis of bone marrow diseases, the characterization of adrenal masses, and the evaluation of heart diseases. Therefore, the rapid and accurate evaluation of fat or iron deposition in anatomy is important in a variety of clinical applications.

One technique for non-invasively diagnosing and quantifying fat deposition in tissues is Magnetic Resonance Imaging (MRI). In MRI, the observed signal of a normal tissue is primarily from the protons in its constituent water molecules. However, in tissues with high levels of fat, the observed signal is a combination of fat and water signals. The total signal corresponding to an image depends on the number of protons, or proton density (PD). To quantify fat in the tissue, the ratio of fat proton density to total fat and water proton density per pixel may be determined. This ratio is known as the proton density fat fraction (PDFF). Various conventional techniques exist for calculating PDFF. However, these methods are typically tied to, and thus limited to, specific vendor/hardware platforms.

Measuring iron with MRI is usually accomplished by measuring the tissue transverse relaxation values ($T_2$ or $T_2^*$) or relaxation rates ($R_2 = 1/T_2$ or $R_2^* = 1/T_2^*$) with MRI, because iron deposition is associated closely with $T_2/T_2^*$ or $R_2/R_2^*$. This is generally accomplished by acquiring multi-echo data and performing a log-linear fitting. However, in the presence of fat, directly measuring $T_2/T_2^*$ or $R_2/R_2^*$ by this kind of method is problematic due to the influence of fat.

Thus, it is desired to develop a technique that allows PDFF calculation across various vendor-specific platforms, while also allowing iron deposition to be accurately quantified.

SUMMARY

Embodiments of the present invention address and overcome one or more of the above shortcomings and drawbacks, by providing methods, systems, and apparatuses for quantifying fat and iron using a multi-step, adaptive fitting approach with multi-echo magnetic resonance imaging. This technology is particularly well-suited for, but by no means limited to, quantifying fat and iron deposition for the treatment of hepatic diseases.

According to some embodiments of the present invention, a computer-implemented method for quantifying fat and iron in anatomical tissue includes acquiring a plurality of multi-echo signal datasets representative of the anatomical tissue using a magnetic resonance (MR) pulse sequence. A plurality of multi-echo signal datasets are selected from the plurality of multi-echo signal datasets. Next, a first water magnitude value and a first fat magnitude value are determined using the selected two multi-echo signal datasets. In one embodiment, the first water magnitude value and the first fat magnitude value are determined by applying a dual-echo flexible-echo time estimation to the selected two multi-echo signal data sets. In other embodiments, the values are determined by applying multi-echo estimation the selected multi-echo signal datasets. Then, in response to determining that the multi-echo signal datasets include at least three multi-echo datasets, a first stage analysis is performed. This first stage analysis comprises selecting a first effective transverse relaxation rate value; creating first algorithm inputs comprising the first water magnitude value, the first fat magnitude value, and the first effective transverse relation rate value; performing a non-linear fitting algorithm based on the first algorithm inputs to calculate a second water magnitude value, a second fat magnitude value, and a second effective transverse relaxation rate value; and determining a first proton density fat fraction value based on the second water magnitude value and the second fat magnitude value.

In one embodiment, the aforementioned method further comprises in response to determining that the multi-echo signal datasets include at least four multi-echo datasets, performing a second stage analysis. The second stage analysis includes determining an initial guess for a third water magnitude value and an initial guess for a third fat magnitude value, determining an initial guess for a water transverse relaxation rate value based on the effective transverse relaxation rate value, and determining an initial guess for a fat transverse relaxation rate value based on the effective transverse relaxation rate value. Next, second algorithm inputs are created comprising the initial guess for the third water magnitude value, the initial guess for the third fat magnitude value, the initial guess for the water transverse relaxation rate value, and the initial guess for the fat transverse relaxation rate value. Then, the non-linear fitting algorithm is performed based on the second algorithm inputs to calculate the third water magnitude value, the third fat magnitude value, the water transverse relaxation rate value, and the fat transverse relaxation rate value. A second proton density fat fraction value may then be determined based on the third water magnitude value and the third fat magnitude value.

The initial guess value for the third water magnitude value and the initial guess value for the third fat magnitude value may be set in a variety of ways. For example, in one embodiment, the values are set based on the first proton density fat fraction value. Specifically, in response to determining that the first proton density fat fraction value is less than a first predetermined constant, the initial guess for the third water magnitude value is set to the second water magnitude value and the initial guess for the third fat magnitude value is set to zero. In response to determining that the first proton density fat fraction value is greater than a second predetermined constant, the initial guess for the third fat magnitude value is set to the second fat magnitude value, and the initial guess for the third water magnitude value is set to zero. In response to determining that the first proton density fat fraction value is greater than the first predetermined constant and less than the second predetermined constant, the initial guess for the third water magnitude value is set to the second water magnitude value, and setting the initial guess for the third fat magnitude value is set to the second fat magnitude value.

According to other embodiments of the present invention, a computer-implemented method for quantifying fat and iron in a portion of patient anatomy includes receiving a plurality of multi-echo signal datasets acquired in response to a multi-echo pulse sequence being applied to the portion of patient anatomy. Two multi-echo signal datasets are selected from the plurality of multi-echo signal datasets. Next, series of values are determined. First, a first water magnitude value and a first fat magnitude value are determined using the selected two multi-echo signal datasets. Second, a second water magnitude value, a second fat magnitude value, and a second effective transverse relaxation rate value across the plurality of multi-echo signal datasets are determined based on the first water magnitude value and the first fat magnitude value. Third, a third water magnitude value, a third fat magnitude value, a water transverse relaxation rate value, and a fat transverse relaxation rate value across the plurality of multi-echo signal datasets are determined based on the second water magnitude value, the second fat magnitude value, and the second effective transverse relaxation rate value. Once these values are determined, a proton density fat fraction value may be calculated based on the third water magnitude value and the third fat magnitude value.

The aforementioned method can be supplemented in a variety of ways. For example, in one embodiment, the method further includes determining an iron deposition value based on at least one of the water transverse relaxation rate value and the fat transverse relaxation rate. The proton density fat fraction value and the iron deposition value may be presented in a graphical user interface. In another embodiment, determining the first water magnitude value and the first fat magnitude value using the selected two multi-echo signal datasets comprises applying a dual-echo flexible-echo time estimation to the selected two multi-echo signal data sets.

In some embodiments, the second water magnitude value, the second fat magnitude value, and the second effective transverse relaxation rate value across the plurality of multi-echo signal datasets are determined by performing a non-linear fitting algorithm to calculate the second water magnitude value, the second fat magnitude value, and the second effective transverse relaxation rate value. In one embodiment, the non-linear fitting algorithm comprises a damped least-squares method.

In some embodiment, an initial proton density fat fraction value may be determined based on the second water magnitude value and the second fat magnitude value calculated in the aforementioned method. This initial proton density fat fraction value may then be used to determine the third water magnitude value, the third fat magnitude value, the water transverse relaxation rate value, and the fat transverse relaxation rate value across the plurality of multi-echo signal datasets. For example, in one embodiments, in response to determining that the initial proton density fat fraction value is less than a first predetermined constant, an initial guess for the third water magnitude value may be set to the second water magnitude value and an initial guess for the third fat magnitude value may be set to zero. In response to determining that the initial proton density fat fraction value is greater than a second predetermined constant, an initial guess for the third fat magnitude value may be set to the second fat magnitude value and an initial guess for the third water magnitude value may be set to zero. In response to determining that the initial proton density fat fraction value is greater than the first predetermined constant and less than the second predetermined constant, an initial guess for the third water magnitude value may be set to the second water magnitude value, and an initial guess for the third fat magnitude value may be set to the second fat magnitude value. Then, the non-linear fitting algorithm may be performed to calculate the third water magnitude value, the third fat magnitude value, the water transverse relaxation rate value, and the fat transverse relaxation rate value based, at least in part, on the initial guess for the third water magnitude value, the initial guess for the third fat magnitude value.

According to another embodiment of the present invention, a system for quantifying fat and iron in anatomical tissue includes an input processor and an image data processor. The input processor is configured to acquire a plurality of MR image representative multi-echo signal datasets of the anatomical tissue acquired using a pulse sequence type. The image data processor is configured to perform an adaptive and progressive multi-step quantification process. In some embodiments, this quantification process includes determining, at a first step, an initial water magnitude value, an initial fat magnitude value, and one or more initial transverse relaxation rate values. Next, one or more subsequent steps are performed, each subsequent step utilizing one or more values determined a prior step in the multi-step quantification process to determine an updated water magnitude value, an updated fat magnitude value, and one or more updated transverse relaxation rate values. Then, a proton density fat fraction value is calculated based on a final water magnitude value and a final fat magnitude value generated during a final subsequent step included in the one or more subsequent steps. In some embodiments, the system also includes a graphical user interface configured to presenting at least one of a fat transverse relaxation map generated based on the final fat magnitude value, a water transverse relaxation map generated based on the final water magnitude value, or a fat fraction map determined based on the proton density fat fraction value.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following figures.

DETAILED DESCRIPTION

The following disclosure describes the present invention according to several embodiments directed at methods, systems, and apparatuses for quantifying fat using a multi-step, adaptive fitting approach with multi-echo magnetic resonance imaging (MRI). Briefly, in various embodiments, a multi-echo MRI acquisition is performed. Two selected echoes from the acquisition are used to provide initial guesses for the fat and water signal fractions. Based on magnitude signal equations, a multi-step non-linear fitting procedure is then performed to quantitatively measure fat and iron with proton density fat fraction (PDFF) values and transverse relaxation rate (e.g., $R^*_2$) values, respectively.

Figure 1:
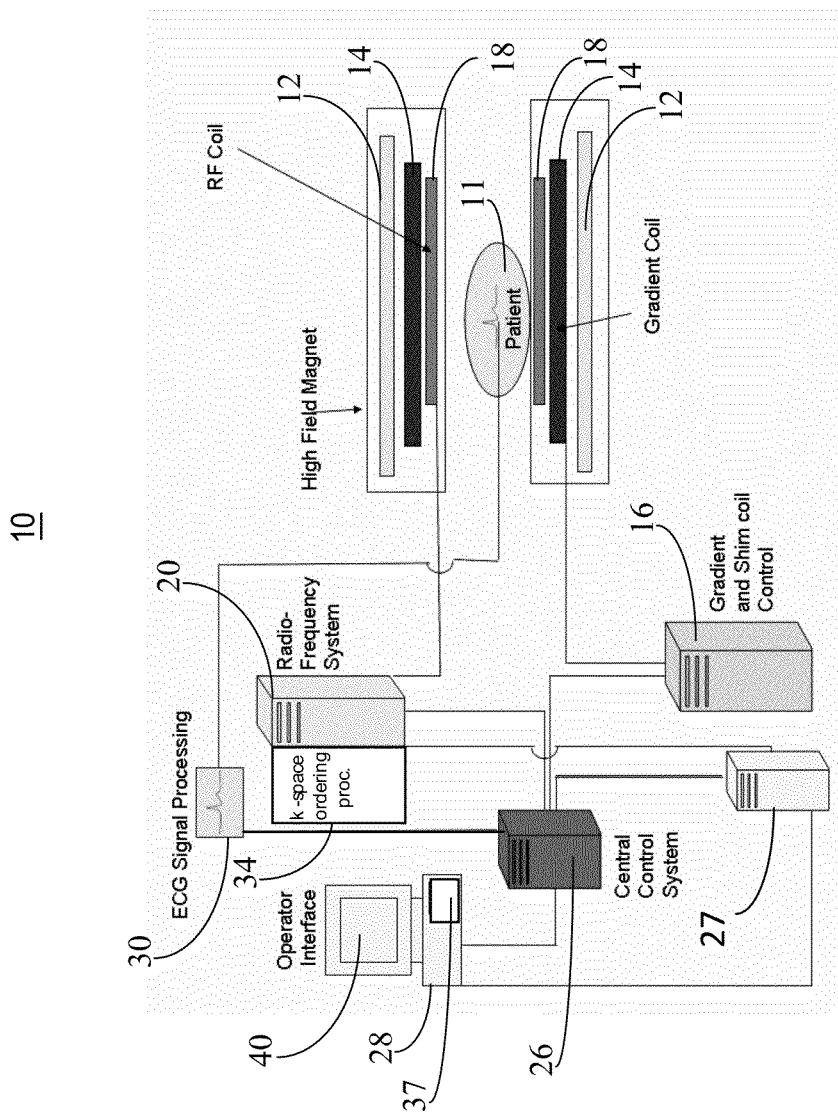
FIG. 1 shows a system for ordering acquisition of frequency domain components representing MR image data for storage in a k-space storage array, according to some embodiments of the present invention.

FIG. 1 shows a system 10 for ordering acquisition of frequency domain components representing MR image data for storage in a k-space storage array, according to some embodiments of the present invention. In system 10, magnet 12 creates a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shimming/pulse sequence control module 16, produce position dependent and shimmed magnetic field gradients in three orthogonal directions and generates magnetic field pulse sequences. The shimmed gradients compensate for inhomogeneity and variability in an MR imaging device magnetic field resulting from patient anatomical variation and other sources. The magnetic field gradients include a slice-selection gradient magnetic field, a phase-encoding gradient magnetic field and a readout gradient magnetic field that are applied to patient 11.

Further, RF (radio frequency) system 20 provides RF pulse signals to RF coil 18, which in response produces magnetic field pulses which rotate the spins of the protons in the imaged body 11 by ninety degrees or by one hundred and eighty degrees for so-called "spin echo" imaging, or by angles less than or equal to 90 degrees for so-called "gradient echo" imaging. Pulse sequence control module 16 in conjunction with RF system 20 as directed by central control system 26, control slice-selection, phase-encoding, readout gradient magnetic fields, radio frequency transmission, and magnetic resonance signal detection, to acquire magnetic resonance signals representing planar slices of patient 11.

In response to applied RF pulse signals, the RF coil 18 receives MR signals, i.e., signals from the excited protons within the body as they return to an equilibrium position established by the static and gradient magnetic fields. The MR signals are detected and processed by a detector within RF system 20 and k-space component processor unit 34 to provide image representative data to an image data processor 27 operably coupled to the central control unit 26. In some embodiments, the image data processor is located within central control unit 26 rather than an external unit, as in FIG. 1. ECG synchronization signal generator 30 provides ECG signals used for pulse sequence and imaging synchronization.

A two or three dimensional k-space storage array of individual data elements in unit 34 stores corresponding individual frequency components comprising an MR dataset. The k-space array of individual data elements has a designated center and individual data elements individually have a radius to the designated center.

A magnetic field generator (comprising magnetic coils 12, 14 and 18) generates a magnetic field for use in acquiring multiple individual frequency components corresponding to individual data elements in the storage array. The individual frequency components are successively acquired in an order in which radius of respective corresponding individual data elements increases and decreases along a substantially spiral path as the multiple individual frequency components is sequentially acquired during acquisition of an MR dataset representing an MR image. A storage processor in unit 34 stores individual frequency components acquired using the magnetic field in corresponding individual data elements in the array. The radius of respective corresponding individual data elements alternately increases and decreases as multiple sequential individual frequency components are acquired. The magnetic field acquires individual frequency components in an order corresponding to a sequence of substantially adjacent individual data elements in the array and magnetic field gradient change between successively acquired frequency components is substantially minimized.

Central control system 26 uses information stored in an internal database to process the detected MR signals in a coordinated manner to generate high quality images of a selected slice (or slices) of the body and adjusts other parameters of system 10. The stored information comprises, for example, predetermined pulse sequence and magnetic field gradient and strength data as well as data indicating timing, orientation and spatial volume of gradient magnetic fields to be applied in imaging. Generated images are presented on display 40. Computer 28 includes a graphical user interface (GUI) enabling user interaction with central controller 26 and enables user modification of magnetic resonance imaging signals in substantially real time. Display processor 37 processes the magnetic resonance signals to provide image representative data for display on display 40, for example.

In various embodiments of the present invention, as described herein, an MRI system such as system 10 of FIG. 1 is used to acquire data for quantifying fat and iron in tissue using a multi-step adaptive fitting approach. Embodiments of the present invention utilize a signal model which is a function of up to four values: $M_w$, $M_f$, $R_{2w}^*$, and $R_{2f}^*$. $M_w$ and $M_f$ are the water and fat signal magnitudes, respectively, of the tissue being sampled. These values are proportional to the proton density of those tissue types. $R_2^*$, and $R_{2f}^*$ are the transverse relaxation rates of water and fat, respectively, for the tissue. If sufficiently low RF flip angles are utilized in the data acquisition, such that longitudinal relaxation ($T_1$) effects can be neglected, then at the n-th echo time ($TE_n$), the acquired MR signal $S_n$ is given by $$S_n = (M_w \cdot e^{-R^*_{2w} TE_n} + c_n M_f \cdot e^{-R^*_{2w} TE_n}) E_n \qquad [1]$$

In this equation, the unknown variables include: $M_w$, $M_f$, $R_{2w}^*$, $R_{2f}^*$, and $E_n$. $E_n$ is a complex phasor, containing any phase errors due to systematic imperfection such as off-resonance, eddy-currents, and gradient delays. The variable $c_n$ is the complex coefficient at $TE_n$ due to the difference of fat and water in the spectrum, and can be calculated based on any fat spectral model, including, without limitation, the simplest with a single peak (e.g., at −3.3 ppm), depending on the body region of interest. In some embodiments, the complex coefficient $c_n$ may be calculated as $$c_n = \sum_{i=1}^{m} w_i e^{j(2\pi \Delta f_i TE_n)} \quad [2]$$

where m is the number of the fat spectral peaks in the model, $w_i$ and $\Delta f_i$ are the fat peak weighting factors and the resonance frequency offsets, respectively, relative to the water peak on the spectrum. The sum of the weighting factors $w_i$ may be normalized to 1.0. The technique for selecting $w_i$ and $\Delta f_i$ may vary across the different embodiments of the present invention. For example, in one embodiment, a seven-fat-peak model is used with weighting factors and resonance frequencies selected based on experimental results. In other embodiments, the weighting factors and resonance frequencies are selected based on conventional values presented, for example, in academic literature.

Among the unknown variables in Equation [1], $E_n$ is generally not of clinical interest. Thus, in some embodiments, it may be removed from the signal model by taking the magnitude on both sides of Equation [1]:

$$|S_n| = |(M_w \cdot e^{-R^*_{2w}TE_n} + c_n M_f \cdot e^{-R^*_{2f}TE_n})| \quad [3]$$

Assuming a known fat spectrum, Equation [3] now has four unknown variables: $M_w$, $M_f$, $R_{2w}^*$ and $R_{2f}^*$ which can be solved using acquisitions with four or more data points. In some embodiments, in order to reduce the complexity of the equation and thus numerically stabilize the solution, the signal model is further simplified by replacing the $R_{2w}^*$ and $R_{2f}^*$ with a single effective $R_{2eff}^*$ for the water-fat mixture. Equations [1] and [3] become, respectively $$S_n = (M_w + c_n M_f) E_n \cdot e^{-R^*_{2eff}TE_n} \quad [4]$$

$$|S_n| = |(M_w + c_n M_f) \cdot e^{-R^*_{2eff}TE_n}| \quad [5]$$

Equation [5] reduces the number of unknown variables to three: $M_w$, $M_f$, and $R_{2eff}^*$, and can be solved by using acquisitions with at least three data points, i.e., where the number of echo datasets acquired is greater than or equal to 3.

One method of solving the unknown variables in non-linear equations such as Eq. [2] and [4] is a non-linear fitting method. In one embodiment, a damped least-squares method, also known as the Levenberg-Marquardt algorithm, is used to provide a numerical solution to the problem of minimizing a function, generally nonlinear, over a space of parameters of the function. In order to use the damped least-squares method, a set of n empirical data values needs to be given as input parameters to the method, along with initial guess values of the unknown variables to be solved. The method provides a solution set of the unknown variables by convergence using an iterative procedure such that the sum of the squares of the deviations of the signal equation is minimal.

In the water-fat quantification context, the set of n empirical data values used as input are the n-echo data, and the initial guess values of $M_w$, $M_f$, $R_{2eff}^*$, $R_{2w}^*$, and/or $R_{2f}^*$. Using this input, the damped least-squares method gives the resultant solution values of $M_w$, $M_f$, $R_{2eff}^*$, $R_{2w}^*$, and/or $R_{2f}^*$. However, in situations where there may be multiple minima (e.g., in the determination water-fat quantification), the method converges only if the initial guesses are already somewhat close to the final solution.

Various constraints may be applied to the aforementioned equations to further refine calculations. For example, in some embodiments, $M_w$ and $M_f$ may be required to be real numbers. In some embodiments, to avoid deviation of the non-linear fitting algorithm from the biologically likely solutions, the values of $R_{2eff}^*$, $R_{2w}^*$, and/or $R_{2f}^*$ may be constrained. For example, in one embodiment, the values are constrained to be greater than 0 s$^{-1}$ and less than 400 s$^{-1}$. $R_2^*$ values greater than 400 s$^{-1}$ can occur in the liver, but are very rare in the fatty liver population. In other embodiments, a range narrower than between 0 and 400 s$^{-1}$ is used to restrict $R_{2f}^*$ during fitting, since iron deposition would influence the water component of tissue, and hence $R_{2w}^*$, while leaving the fat component of tissue relatively unaffected.

Figure 2:
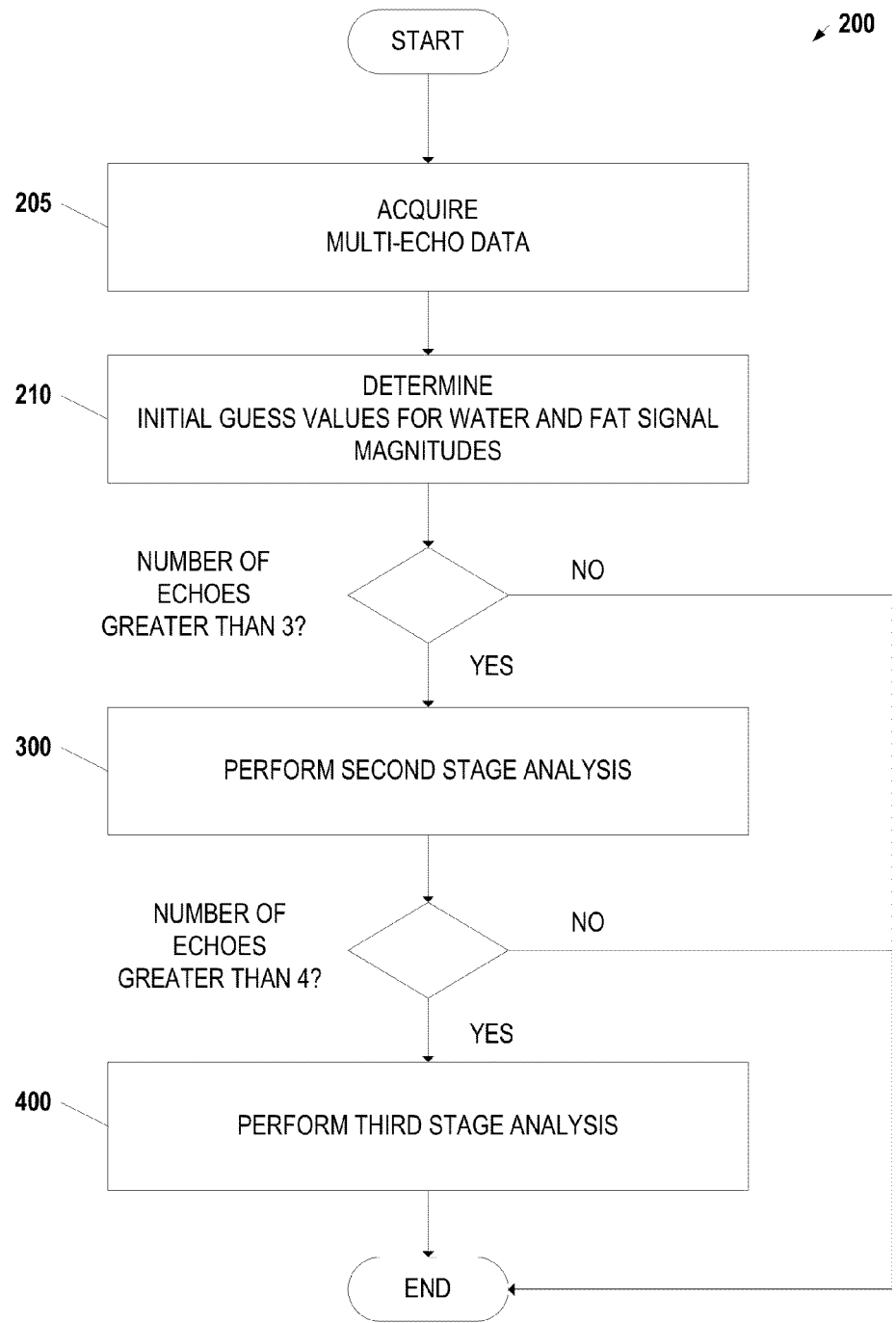
FIG. 2 provides a multi-step adaptive fitting process for fat and iron quantification, according to some embodiments of the present invention.

FIG. 2 provides a multi-step adaptive fitting process 200 for fat and iron quantification, according to some embodiments of the present invention. Step-wise initial guess estimation is used for the proposed method 200, taking into account the requirements for convergence of a non-linear fitting algorithm. The process 200 begins at 205 where a plurality of multi-echo signal datasets is acquired, for example, using system 10. Each respective multi-echo signal dataset corresponds to echo data received following application of a MRI pulse sequence. The method 200 is readily applicable to various sequence types. For example, in some embodiments, a Spoiled Gradient Echo (GRE) technique such as, without limitation, FLASH, TurboFLASH, SPGR, or FastSPGR may be used for acquiring the multi-echo signal datasets.

Once the multi-echo sequence data is acquired at 205, datasets corresponding to at least two echoes or all echoes are used at 210 to determine initial guesses for the magnitude of water and fat signal ($M_w$ and $M_f$, respectively). In some embodiments, the two datasets utilized at 210 correspond to the first two echoes in the MRI pulse sequence. In other embodiments, the datasets utilized at 210 correspond to all the echoes in the MRI pulse sequence. The initial guesses for the magnitude values may be determined using any technique known in the art. For example, in one embodiment, an adapted dual-echo flexible-TE method is used to provide the initial guesses for $M_w$ and $M_f$. In other embodiments, multi-echo estimation is used to provide these initial guess values. Using the initial guess values, a simple fat-water separation can be performed which includes the spectral fat model but does not account for decay of transverse magnetization ($T_2^*$/$R_2^*$) effects. For example, in one embodiment, the fat-water separation is based on the signal equation below, which is simplified from Equation [4]:

$$S_n = (M_w + c_n M_f) E_n \quad [6]$$

In other embodiments, various other techniques or equations may be used to perform the fat-water separation at 210.

Continuing with reference to FIG. 2, following the determination of the initial guesses for $M_w$ and $M_f$ at 210, if the multi-echo signal datasets acquired at 205 include data for less than 3 echoes, the process 200 terminates. Otherwise, the process 200 continues to 300, where a second stage analysis is performed. This second stage analysis updates the values for $M_w$ and $M_f$ using a non-linear fitting algorithm and then calculates a proton density fat fraction (PDFF) and an effective transverse relaxation rate $R_{2eff}^*$. The second stage analysis performed at 300 is described in further detail below with reference to FIG. 3. Following 300, if the multi-echo signal datasets acquired at 205 include data for less than 4 echoes, the process 200 terminates. However, if the multi-echo signal datasets include data for 4 or more echoes, the process 200 continues to a third stage analysis 400 where the values for $M_w$ and $M_f$ are again updated using a non-linear fitting algorithm. These updated values are then used to calculated a new PDFF, as well as the transverse relaxation rates of water and fat (e.g., $R^*_{2w}$, and $R^*_{2f}$ respectively). The third stage analysis performed at 400 is described in more detailed below with reference to FIG. 4.

Figure 3:
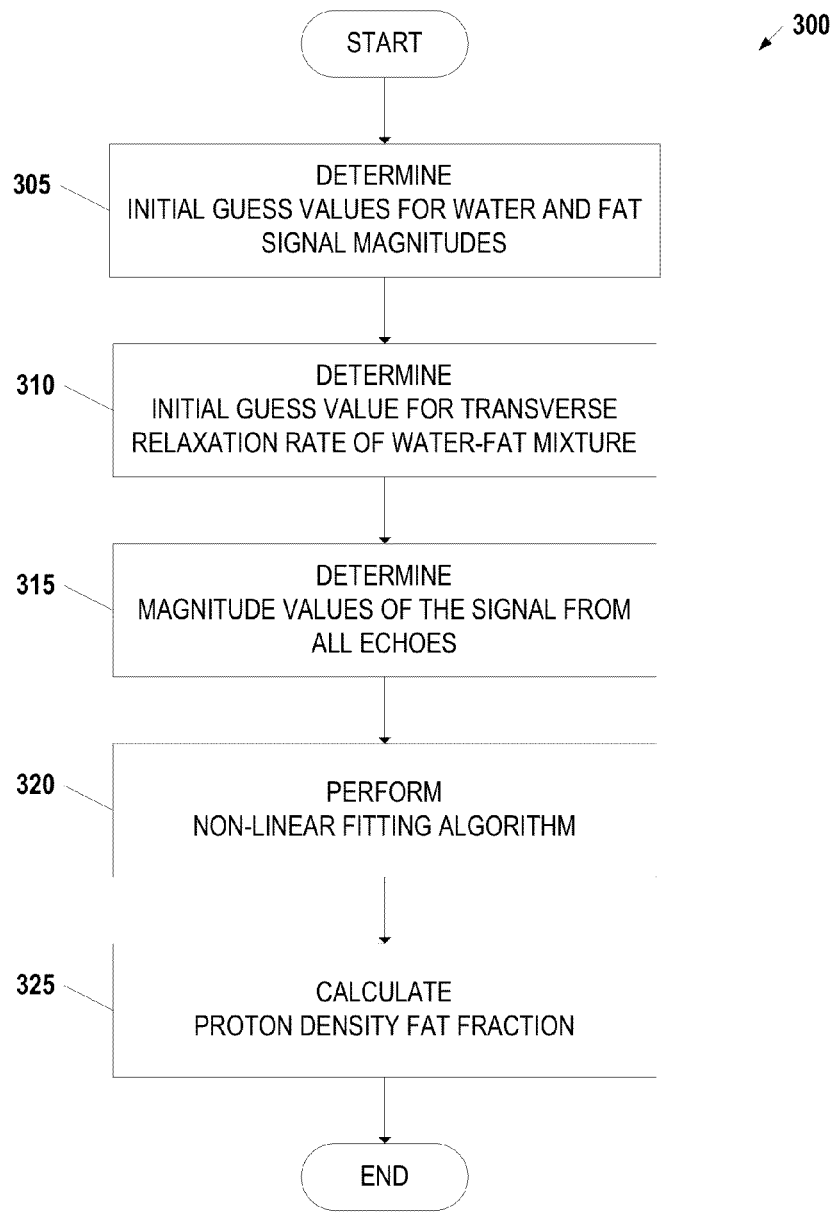
FIG. 3 provides an overview of a process for calculating a PDFF based on a single effective transverse relaxation rates of a water-fat mixture, according to some embodiments of the present invention.

FIG. 3 provides an overview of the process 300 of calculating a PDFF based on a single effective transverse relaxation rates ($R_{2eff}^*$) for a water-fat mixture, according to some embodiments of the present invention. This process 300 may be used, for example, when the multi-echo signal datasets acquired at 205 include data for 3 or more echoes. At 305, the initial guesses for the magnitude values of the water and fat results from 205 are used as the initial guesses for the corresponding second stage values $M_{w2}$ and $M_{f2}$, respectively. Next, at 310, a constant value is used as the initial guess for $R_{2eff}^*$. This constant value may be set based on, for example, prior knowledge of an appropriate range of values (e.g., acquired from academic literature) or experimental results. In one embodiment, the constant value is 30 s$^{-1}$.

Continuing with reference to FIG. 3, at 315, magnitude values of the signal from all echoes are determined. Then, at 320, a non-linear least-squares fitting algorithm is used to update the values for $M_{w2}$, $M_{f2}$, and $R_{2eff}^*$. This fitting may be optimized using any approach known in the art. For example, in some embodiments, the Levenberg-Marquardt algorithm is used to derive solutions of $M_w$, $M_f$, and $R_{2eff}^*$. In the case of multiple potential minima, the algorithm may converge correctly only if the initial guesses are already somewhat close to the final solutions. Thus, in some embodiments, a conventional technique such as the two-point Dixon technique for water-fat signal decomposition may be used to obtain initial guesses for the water and fat signal fractions which are close to the final solution, thus promoting convergence to the correct minima. Returning to FIG. 3, once the values for $M_{w2}$ and $M_{f2}$, have been updated at 320, they may be used at 325 to generate a new PDFF according to the following equation:

$$PDFF_2 = \frac{M_{f2}}{(M_{w2} + M_{f2})}$$

Figure 4:
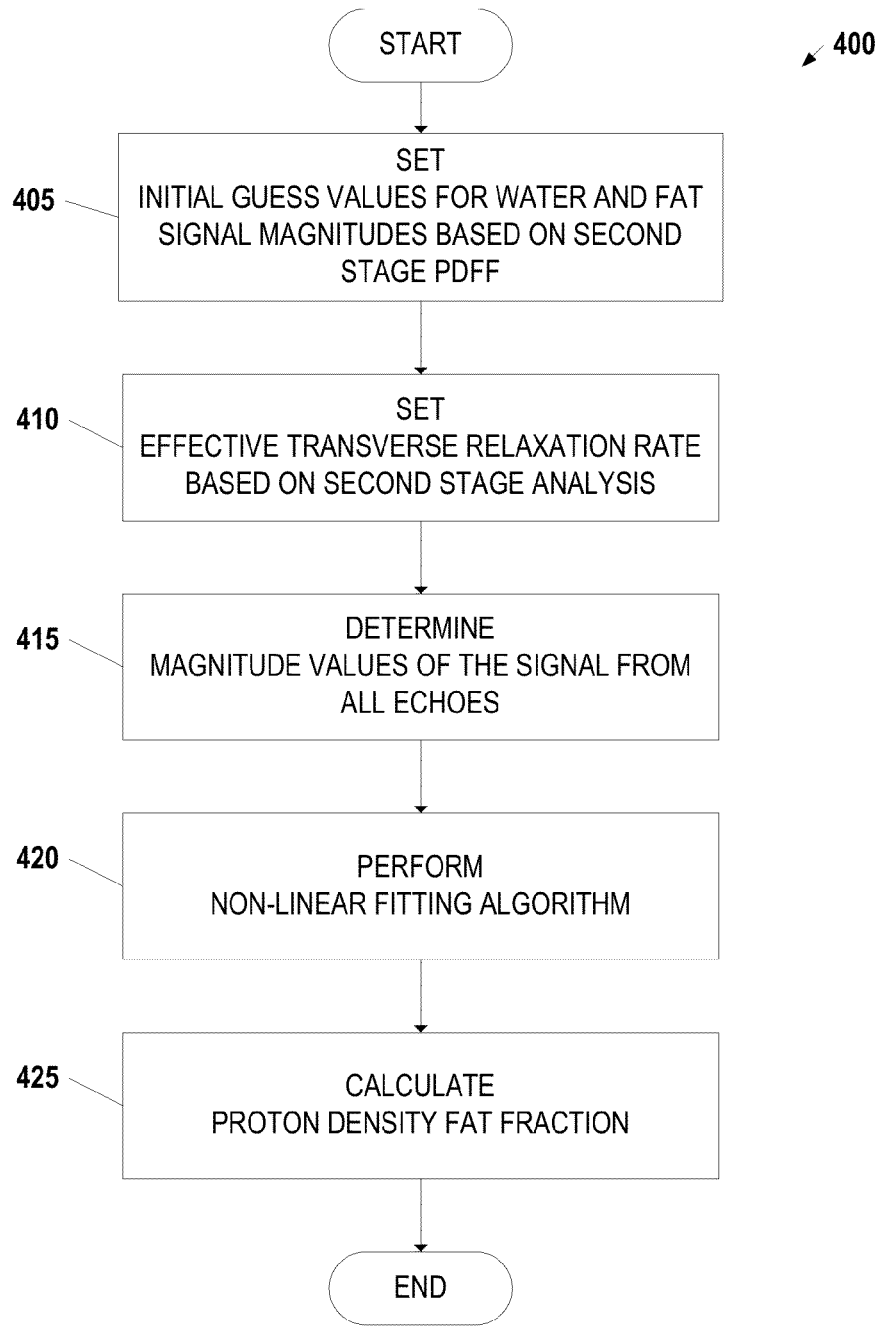
FIG. 4 provides an overview of a process for calculating a PDFF based on the transverse relaxation rates of water and fat, according to some embodiments of the present invention.

FIG. 4 provides an overview of the process 400 of calculating a PDFF based on the transverse relaxation rates of water and fat (e.g., $R_{2w}^*$, and $R_{2f}^*$ respectively), according to some embodiments of the present invention. This process 400 may be used when the multi-echo signal datasets acquired at 205 include data for 4 or more echoes. At 405, initial values the magnitude of water and fat signal ($M_{w3}$ and $M_{f3}$, respectively) are determined based on the proton density fat fraction PDFF$_2$ calculated at 325 (see FIG. 3). In some embodiments, one or more constants may be used to set the initial values $M_{w3}$, $M_{f3}$. For example, if the value of PDFF$_2$ is less than a first constant (e.g., 0.2), the initial value of $M_{w3}$ may be set equal to $M_{w2}$ and the value of $M_{f3}$ is set to 0. If the value of PDFF$_2$ is greater than a second constant (e.g., 0.8), the initial value of $M_{f3}$ may be set equal to $M_{f2}$ and the value of $M_{w3}$ is set to 0. If the value of PDFF$_2$ is neither less than the first constant, nor greater than the second constant, the second stage values may be used for the initial guesses for fat and water magnitudes (i.e., $M_{f3}$ is set equal to $M_{f2}$ and $M_{w3}$ is set equal to $M_{w2}$.). At 410, $R_{2eff}^*$ is used as the initial guess value for both $R_{2w}^*$ and $R_{2f}^*$.

Continuing with reference to FIG. 4, at 415, the magnitude values of the signal from all echoes are determined. Next, at 420 a non-linear least-squares fitting algorithm (e.g., Levenberg-Marquardt) based on Equation [3] is used to update the values for $M_{w3}$, $M_{f3}$, $R_{2w}^*$, and $R_{2f}^*$. Then, at 425, a proton density fat fraction is generated according to the following equation:

$$PDFF_3 = \frac{M_{f3}}{(M_{w3} + M_{f3})}$$

A graphical user interface (GUI) may be used during any step in the processes 200, 300, and 400 (described in FIGS. 3-4, respectively) to allow a user to customize various values, as well as view the intermediary and final results of the processes. For example, in one embodiment, the various constants used in 405 of process 400 (see FIG. 4) may be modified by the user at run time via the GUI. In some embodiments, at the conclusion of process 400, the GUI presents the final proton density fat fraction value and an iron deposition value (determined via the transverse relaxation rates $R_{2w}^*$, and $R_{2f}^*$.) In other embodiments, $R_2^*$ maps for the water and/or fat rates are reconstructed using the acquired plurality of multi-echo signal datasets and presented in the GUI.

Figure 5:
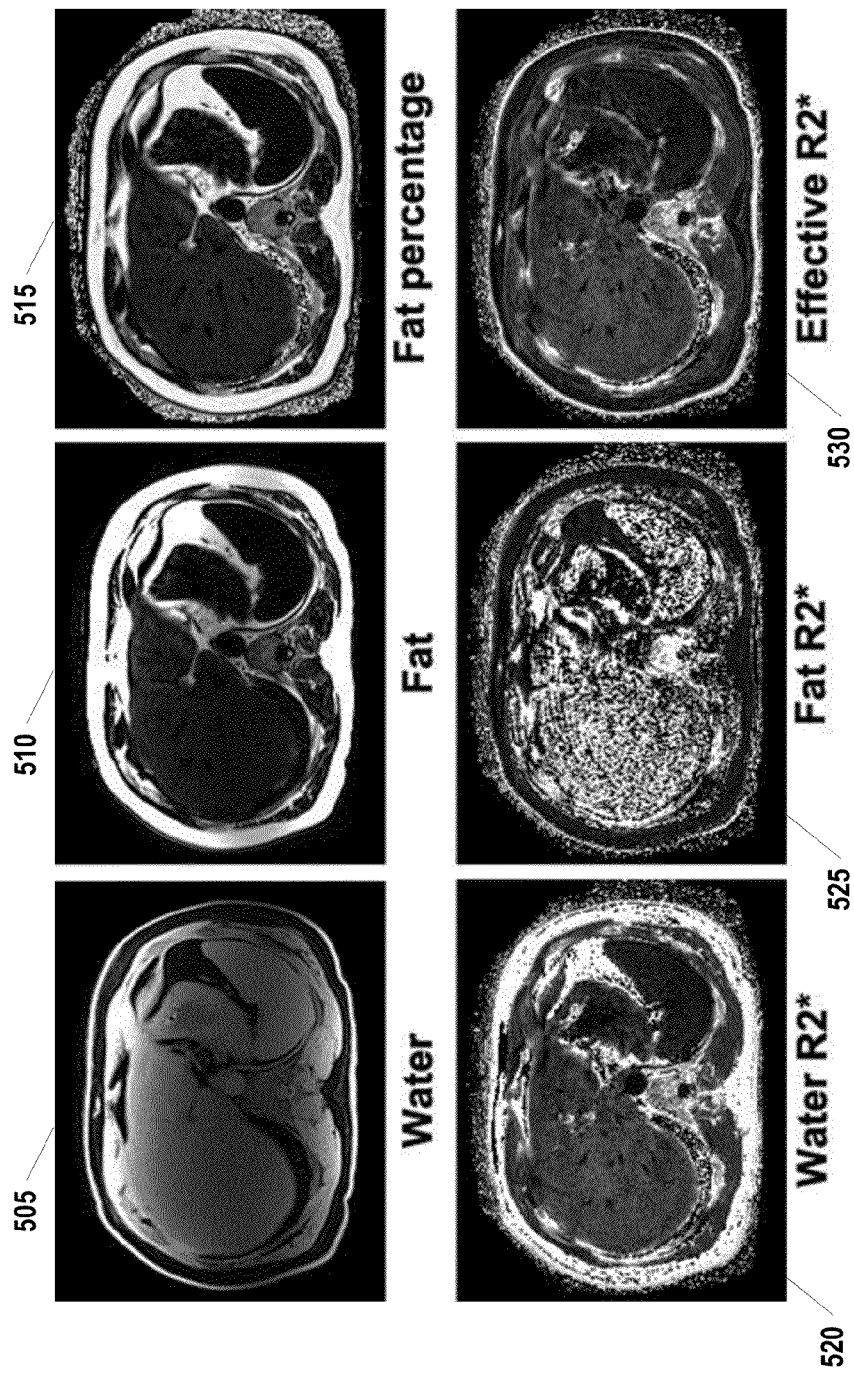
FIG. 5 shows example results of liver fat and iron quantification, as determined by one embodiment of the present invention.

FIG. 5 shows example results of liver fat and iron quantification, as determined by one embodiment of the present invention. Images 505 and 510 show maps of the water and fat content, respectively, in the example liver. Image 515 shows a fat percentage map that may be generated based on, for example, one or more of the PDFF values generated by process 200 illustrated in FIG. 2. Image 530 shows a map of the effective transverse relaxation rate of the fat-water mixture that may generated, for example, based on the $R_{2eff}^*$ values determined during process 300 illustrated in FIG. 3. Finally, images 520 and 525 show maps of the transverse relaxation rate for water and fat, respectively, that may be generated, for example, based on the values of $R_2^*$, and $R_{2f}^*$ determined in the process 400 illustrated in FIG. 4.

Figure 6:
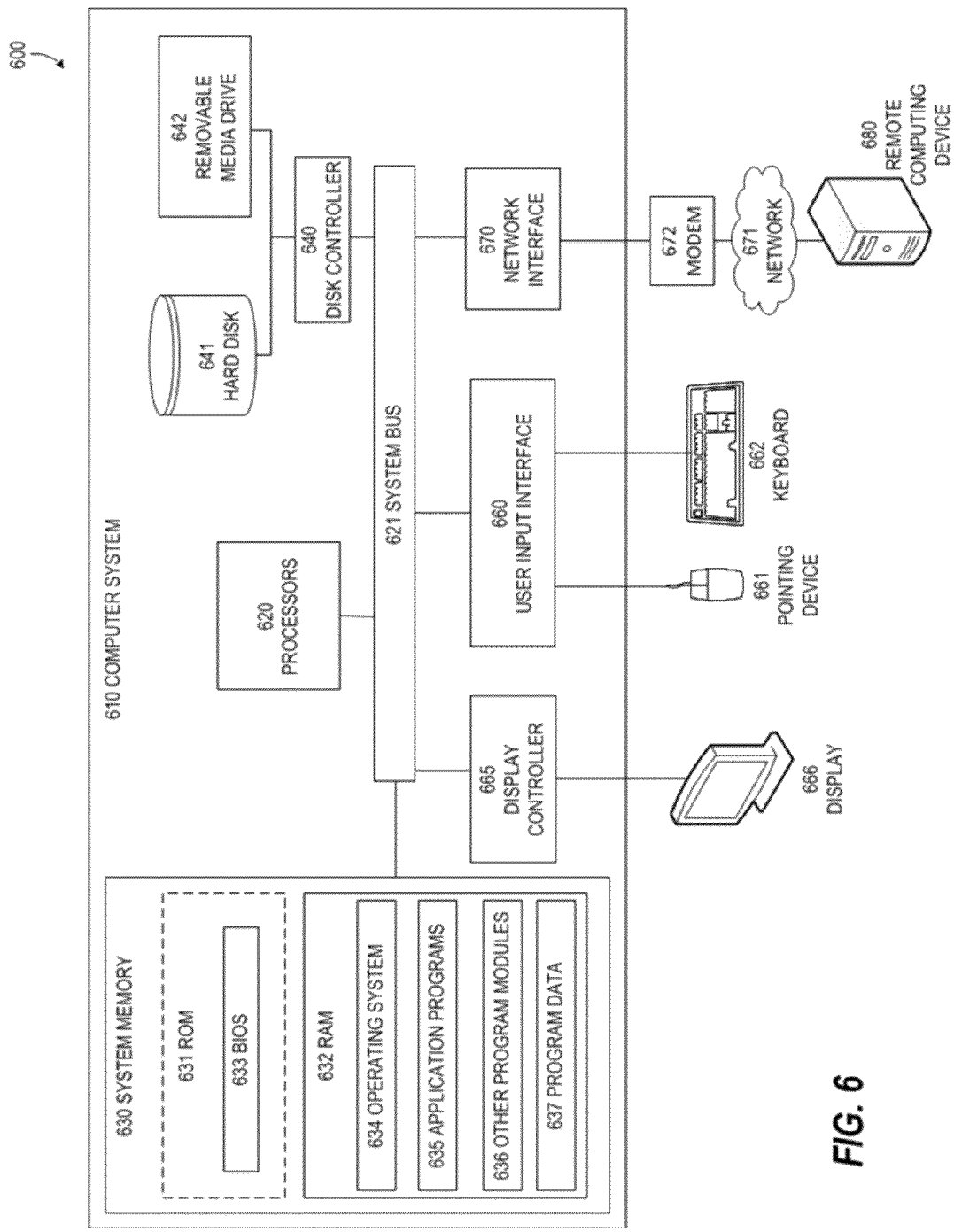
FIG. 6 illustrates an exemplary computing environment within which embodiments of the invention may be implemented.

FIG. 6 illustrates an exemplary computing environment 600 within which embodiments of the invention may be implemented. Computing environment 100 may include computer system 610, which is one example of a purpose computing system upon which embodiments of the invention may be implemented. Computers and computing environments, such as computer 610 and computing environment 600, are known to those of skill in the art and thus are described briefly here.

As shown in FIG. 6, the computer system 610 may include a communication mechanism such as a bus 621 or other communication mechanism for communicating information within the computer system 610. The system 610 further includes one or more processors 620 coupled with the bus 621 for processing the information.

The processors 620 may include one or more central processing units (CPUs), graphical processing units (GPUs), or any other processor known in the art. More generally, a processor as used herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a computer, controller or microprocessor, for example, and is conditioned using executable instructions to perform special purpose functions not performed by a general purpose computer. A processor may be coupled (electrically and/or as comprising executable components) with any other processor enabling interaction and/or communication there-between. A user interface processor or generator is a known element comprising electronic circuitry or software or a combination of both for generating display images or portions thereof. A user interface comprises one or more display images enabling user interaction with a processor or other device.

Continuing with reference to FIG. 6, the computer system 610 also includes a system memory 630 coupled to the bus 621 for storing information and instructions to be executed by processors 620. The system memory 630 may include computer readable storage media in the form of volatile and/or nonvolatile memory, such as read only memory (ROM) 631 and/or random access memory (RAM) 632. The system memory RAM 632 may include other dynamic storage device(s) (e.g., dynamic RAM, static RAM, and synchronous DRAM). The system memory ROM 631 may include other static storage device(s) (e.g., programmable ROM, erasable PROM, and electrically erasable PROM). In addition, the system memory 630 may be used for storing temporary variables or other intermediate information during the execution of instructions by the processors 620. A basic input/output system 633 (BIOS) containing the basic routines that help to transfer information between elements within computer system 610, such as during start-up, may be stored in ROM 631. RAM 632 may contain data and/or program modules that are immediately accessible to and/or presently being operated on by the processors 620. System memory 630 may additionally include, for example, operating system 634, application programs 635, other program modules 636 and program data 637.

The computer system 610 also includes a disk controller 640 coupled to the bus 621 to control one or more storage devices for storing information and instructions, such as a magnetic hard disk 641 and a removable media drive 642 (e.g., floppy disk drive, compact disc drive, tape drive, and/or solid state drive). The storage devices may be added to the computer system 610 using an appropriate device interface (e.g., a small computer system interface (SCSI), integrated device electronics (IDE), Universal Serial Bus (USB), or FireWire).

The computer system 610 may also include a display controller 665 coupled to the bus 621 to control a display or monitor 665, such as a cathode ray tube (CRT) or liquid crystal display (LCD), for displaying information to a computer user. The computer system includes an input interface 660 and one or more input devices, such as a keyboard 661 and a pointing device 662, for interacting with a computer user and providing information to the processor 620. The pointing device 662, for example, may be a mouse, a light pen, a trackball, or a pointing stick for communicating direction information and command selections to the processor 620 and for controlling cursor movement on the display 666. The display 666 may provide a touch screen interface which allows input to supplement or replace the communication of direction information and command selections by the pointing device 661.

The computer system 610 may perform a portion or all of the processing steps of embodiments of the invention in response to the processors 620 executing one or more sequences of one or more instructions contained in a memory, such as the system memory 630. Such instructions may be read into the system memory 630 from another computer readable medium, such as a hard disk 641 or a removable media drive 642. The hard disk 641 may contain one or more datastores and data files used by embodiments of the present invention. Datastore contents and data files may be encrypted to improve security. The processors 620 may also be employed in a multi-processing arrangement to execute the one or more sequences of instructions contained in system memory 630. In alternative embodiments, hard-wired circuitry may be used in place of or in combination with software instructions. Thus, embodiments are not limited to any specific combination of hardware circuitry and software.

As stated above, the computer system 610 may include at least one computer readable medium or memory for holding instructions programmed according embodiments of the invention and for containing data structures, tables, records, or other data described herein. The term "computer readable medium" as used herein refers to any medium that participates in providing instructions to the processor 620 for execution. A computer readable medium may take many forms including, but not limited to, non-volatile media, volatile media, and transmission media. Non-limiting examples of non-volatile media include optical disks, solid state drives, magnetic disks, and magneto-optical disks, such as hard disk 641 or removable media drive 642. Non-limiting examples of volatile media include dynamic memory, such as system memory 630. Non-limiting examples of transmission media include coaxial cables, copper wire, and fiber optics, including the wires that make up the bus 621. Transmission media may also take the form of acoustic or light waves, such as those generated during radio wave and infrared data communications.

The computing environment 600 may further include the computer system 620 operating in a networked environment using logical connections to one or more remote computers, such as remote computer 680. Remote computer 680 may be a personal computer (laptop or desktop), a mobile device, a server, a router, a network PC, a peer device or other common network node, and typically includes many or all of the elements described above relative to computer 610. When used in a networking environment, computer 610 may include modem 672 for establishing communications over a network 671, such as the Internet. Modem 672 may be connected to system bus 621 via user network interface 670, or via another appropriate mechanism.

Network 671 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 610 and other computers (e.g., remote computing system 680). The network 671 may be wired, wireless or a combination thereof. Wired connections may be implemented using Ethernet, Universal Serial Bus (USB), RJ-6 or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 671.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

A graphical user interface (GUI), as used herein, comprises one or more display images, generated by a display processor and enabling user interaction with a processor or other device and associated data acquisition and processing functions. The GUI also includes an executable procedure or executable application. The executable procedure or executable application conditions the display processor to generate signals representing the GUI display images. These signals are supplied to a display device which displays the image for viewing by the user. The processor, under control of an executable procedure or executable application, manipulates the UI display images in response to signals received from the input devices. In this way, the user interacts with the display image using the input devices, enabling user interaction with the processor or other device.

The functions and process steps herein may be performed automatically or wholly or partially in response to user command. An activity (including a step) performed automatically is performed in response to executable instruction or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. Further, the processes and applications may, in alternative embodiments, be located on one or more (e.g., distributed) processing devices on a network linking the units of FIGS. 1 and 6. As described herein, the various systems, subsystems, agents, managers and processes can be implemented using hardware components, software components, and/or combinations thereof. No claim element herein is to be construed under the provisions of 35 U.S.C. 112, sixth paragraph, unless the element is expressly recited using the phrase "means for."

The invention claimed is:

1. A computer-implemented method for quantifying fat and iron in anatomical tissue, the method comprising:
   acquiring a plurality of multi-echo signal datasets representative of the anatomical tissue using a magnetic resonance (MR) pulse sequence;
   selecting two multi-echo signal datasets from the plurality of multi-echo signal datasets;
   determining a first water magnitude value and a first fat magnitude value using the selected two multi-echo signal datasets; and
   in response to determining that the multi-echo signal datasets include at least three multi-echo datasets, performing a first stage analysis comprising:
      selecting a first effective transverse relaxation rate value,
      creating first algorithm inputs comprising the first water magnitude value, the first fat magnitude value, and the first effective transverse relaxation rate value,
      performing a non-linear fitting algorithm based on the first algorithm inputs to calculate a second water magnitude value, a second fat magnitude value, and a second effective transverse relaxation rate value, and
      determining a first proton density fat fraction value based on the second water magnitude value and the second fat magnitude value.

2. The method of claim 1, wherein determining the first water magnitude value and the first fat magnitude value using the selected two multi-echo signal datasets comprises:
   applying a dual-echo flexible-echo time estimation to the selected two multi-echo signal data sets.

3. The method of claim 1, wherein determining the first water magnitude value and the first fat magnitude value using the selected two multi-echo signal datasets comprises:
   applying multi-echo estimation to the selected two multi-echo signal datasets.

4. The method of claim 1, further comprising:
   in response to determining that the multi-echo signal datasets include at least four multi-echo datasets, performing a second stage analysis comprising:
      determining an initial guess for a third water magnitude value and an initial guess for a third fat magnitude value,
      determining an initial guess for a water transverse relaxation rate value based on an effective transverse relaxation rate value,
      determining an initial guess for a fat transverse relaxation rate value based on the effective transverse relaxation rate value,
      creating second algorithm inputs comprising the initial guess for the third water magnitude value, the initial guess for the third fat magnitude value, the initial guess for the water transverse relaxation rate value, and the initial guess for the fat transverse relaxation rate value,
      performing the non-linear fitting algorithm based on the second algorithm inputs to calculate the third water magnitude value, the third fat magnitude value, the water transverse relaxation rate value, and the fat transverse relaxation rate value, and
      determining a second proton density fat fraction value based on the third water magnitude value and the third fat magnitude value.

5. The method of claim 4, wherein determining the initial guess for the third water magnitude value and the initial guess for the third fat magnitude value comprises:
   in response to determining that the first proton density fat fraction value is less than a first predetermined constant,
      setting the initial guess for the third water magnitude value to the second water magnitude value, and
      setting the initial guess for the third fat magnitude value to zero.

6. The method of claim 5, wherein determining the initial guess for the third water magnitude value and the initial guess for the third fat magnitude value further comprises:
   in response to determining that the first proton density fat fraction value is greater than a second predetermined constant,
      setting the initial guess for the third fat magnitude value to the second fat magnitude value, and
      setting the initial guess for the third water magnitude value to zero.

7. The method of claim 6, wherein determining the initial guess for the third water magnitude value and the initial guess for the third fat magnitude value further comprises:
   in response to determining that the first proton density fat fraction value is greater than the first predetermined constant and less than the second predetermined constant,
      setting the initial guess for the third water magnitude value to the second water magnitude value, and
      setting the initial guess for the third fat magnitude value to the second fat magnitude value.

8. A computer-implemented method for quantifying fat and iron in a portion of patient anatomy, the method comprising:

receiving a plurality of multi-echo signal datasets acquired in response to a multi-echo pulse sequence being applied to the portion of patient anatomy;

selecting two multi-echo signal datasets from the plurality of multi-echo signal datasets;

determining a first water magnitude value and a first fat magnitude value using the selected two multi-echo signal datasets;

determining a second water magnitude value, a second fat magnitude value, and a second effective transverse relaxation rate value across the plurality of multi-echo signal datasets based on the first water magnitude value and the first fat magnitude value;

determining a third water magnitude value, a third fat magnitude value, a water transverse relaxation rate value, and a fat transverse relaxation rate value across the plurality of multi-echo signal datasets based on the second water magnitude value, the second fat magnitude value, and the second effective transverse relaxation rate value; and calculating a proton density fat fraction value based on the third water magnitude value and the third fat magnitude value.

9. The method of claim 8, further comprising:

determining an iron deposition value based on at least one of the water transverse relaxation rate value and the fat transverse relaxation rate value.

10. The method of claim 9, further comprising:

presenting the proton density fat fraction value and the iron deposition value in a graphical user interface.

11. The method of claim 8, wherein determining the first water magnitude value and the first fat magnitude value using the selected two multi-echo signal datasets comprises:

applying a dual-echo flexible-echo time estimation to the selected two multi-echo signal data sets.

12. The method of claim 8, wherein determining the second water magnitude value, the second fat magnitude value, and the second effective transverse relaxation rate value across the plurality of multi-echo signal datasets based on the first water magnitude value and the first fat magnitude value comprises:

performing a non-linear fitting algorithm to calculate the second water magnitude value, the second fat magnitude value, and the second effective transverse relaxation rate value.

13. The method of claim 12, wherein the non-linear fitting algorithm comprises a damped least-squares method.

14. The method of claim 12, further comprising:

calculating an initial proton density fat fraction value based on the second water magnitude value and the second fat magnitude value.

15. The method of claim 14, wherein determining the third water magnitude value, the third fat magnitude value, the water transverse relaxation rate value, and the fat transverse relaxation rate value across the plurality of multi-echo signal datasets based on the second water magnitude value, the second fat magnitude value, and the second effective transverse relaxation rate value comprises:

in response to determining that the initial proton density fat fraction value is less than a first predetermined constant, setting an initial guess for the third water magnitude value to the second water magnitude value, and setting an initial guess for the third fat magnitude value to zero.

16. The method of claim 15, wherein determining the third water magnitude value, the third fat magnitude value, the water transverse relaxation rate value, and the fat transverse relaxation rate value across the plurality of multi-echo signal datasets based on the second water magnitude value, the second fat magnitude value, and the second effective transverse relaxation rate value further comprises:

in response to determining that the initial proton density fat fraction value is greater than a second predetermined constant, setting an initial guess for the third fat magnitude value to the second fat magnitude value, and setting an initial guess for the third water magnitude value to zero.

17. The method of claim 16, wherein determining the third water magnitude value, the third fat magnitude value, the water transverse relaxation rate value, and the fat transverse relaxation rate value across the plurality of multi-echo signal datasets based on the second water magnitude value, the second fat magnitude value, and the second effective transverse relaxation rate value further comprises:

in response to determining that the initial proton density fat fraction value is greater than the first predetermined constant and less than the second predetermined constant, setting an initial guess for the third water magnitude value to the second water magnitude value, and setting an initial guess for the third fat magnitude value to the second fat magnitude value.

18. The method of claim 17, wherein determining the third water magnitude value, the third fat magnitude value, the water transverse relaxation rate value, and the fat transverse relaxation rate value across the plurality of multi-echo signal datasets based on the second water magnitude value, the second fat magnitude value, and the second effective transverse relaxation rate value further comprises:

performing the non-linear fitting algorithm to calculate the third water magnitude value, the third fat magnitude value, the water transverse relaxation rate value, and the fat transverse relaxation rate value based at least in part on the initial guess for the third water magnitude value, the initial guess for the third fat magnitude value.

19. A system for quantifying fat and iron in anatomical tissue, the system comprising:

an input processor configured to acquire a plurality of MR image representative multi-echo signal datasets of the anatomical tissue acquired using a pulse sequence type; and an image data processor configured to perform an adaptive and progressive multi-step quantification process, the process comprising:

determining, at a first step, an initial water magnitude value, an initial fat magnitude value, and one or more initial transverse relaxation rate values, performing one or more subsequent steps, each subsequent step utilizing one or more values determined a prior step in the multi-step quantification process to determine an updated water magnitude value, an updated fat magnitude value, and one or more updated transverse relaxation rate values, and calculating a proton density fat fraction value based on a final water magnitude value and a final fat magnitude value generated during a final subsequent step included in the one or more subsequent steps.

20. The system of claim 19, further comprising:
a graphical user interface configured to present at least one of a fat transverse relaxation map generated based on the final fat magnitude value, a water transverse relaxation map generated based on the final water magnitude value, or a fat fraction map determined based on the proton density fat fraction value.

* * * * *